(12) United States Patent
Long et al.

(10) Patent No.: US 10,847,345 B2
(45) Date of Patent: *Nov. 24, 2020

(54) DIRECT DRIVE RF CIRCUIT FOR SUBSTRATE PROCESSING SYSTEMS

(71) Applicant: LAM RESEARCH CORPORATION, Fremont, CA (US)

(72) Inventors: Maolin Long, Santa Clara, CA (US); Alexander Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/705,588

(22) Filed: Dec. 6, 2019

(65) Prior Publication Data

US 2020/0111644 A1    Apr. 9, 2020

Related U.S. Application Data

(63) Continuation of application No. 16/007,481, filed on Jun. 13, 2018, now Pat. No. 10,515,781.

(51) Int. Cl.
    *H01J 37/32*         (2006.01)
    *H03K 5/135*      (2006.01)
    *H03K 5/00*       (2006.01)

(52) U.S. Cl.
    CPC .. *H01J 37/32155* (2013.01); *H01J 37/32183* (2013.01); *H03K 5/135* (2013.01);
(Continued)

(58) Field of Classification Search
    CPC .............. H01J 37/321; H01J 37/32155; H01J 37/32183; H01J 2237/327;
(Continued)

(56) References Cited

U.S. PATENT DOCUMENTS 9,293,353 B2    3/2016    Long et al.
9,378,931 B2    6/2016    Kwon et al.
(Continued)

FOREIGN PATENT DOCUMENTS

| JP | 2010238881 A | 10/2010 |
|---|---|---|
| JP | 2016009733 A | 1/2016 |
| KR | 20160050396 A | 5/2016 |

OTHER PUBLICATIONS

International Search Report and Written Opinion for PCT Application No. PCT/US2018/035026 dated Sep. 21, 2018; 8 pages.
(Continued)

*Primary Examiner* — Henry Luong (57) ABSTRACT

A direct drive circuit for providing RF power to a component of a substrate processing system includes a clock generator to generate a clock signal at a first frequency, a gate driver to receive the clock signal and a half bridge circuit. The half bridge circuit includes a first switch with a control terminal connected to the gate driver, a first terminal and a second terminal; a second switch with a control terminal connected to the gate driver, a first terminal connected to the second terminal of the first switch and an output node, and a second terminal; a first DC supply to supply a first voltage to the first terminal of the first switch; and a second DC supply to supply a second voltage to the second terminal of the second switch. The first and the second voltages have opposite polarities and are approximately equal in magnitude.

8 Claims, 6 Drawing Sheets

(52) U.S. Cl.
CPC ... *H01J 37/321* (2013.01); *H01J 2237/24564* (2013.01); *H01J 2237/327* (2013.01); *H03K 5/00006* (2013.01); *H03K 2005/00286* (2013.01)

(58) Field of Classification Search
CPC .......... H01J 2237/24564; H03K 5/135; H03K 5/00006; H03K 2005/00286
See application file for complete search history.

(56) References Cited

U.S. PATENT DOCUMENTS

| | | | |
|---|---|---|---|
| 9,455,153 | B2 | 9/2016 | Koguchi et al. |
| 9,515,633 | B1 | 12/2016 | Long et al. |
| 9,583,357 | B1 | 2/2017 | Long et al. |
| 9,711,375 | B2 | 7/2017 | Terauchi et al. |
| 10,515,781 | B1* | 12/2019 | Long ................. H01J 37/32155 |
| 2003/0196757 | A1 | 10/2003 | Todorow et al. |
| 2006/0017388 | A1* | 1/2006 | Stevenson ............. H01J 37/321 315/111.51 |
| 2006/0088655 | A1 | 4/2006 | Collins et al. |
| 2008/0179948 | A1 | 7/2008 | Nagarkatti et al. |
| 2009/0026181 | A1 | 1/2009 | Kirchmeier et al. |
| 2010/0171428 | A1 | 7/2010 | Kirchmeier et al. |
| 2011/0214811 | A1 | 9/2011 | Ashida |
| 2012/0000887 | A1 | 1/2012 | Eto et al. |
| 2012/0000888 | A1 | 1/2012 | Kawasaki et al. |
| 2013/0135058 | A1 | 5/2013 | Long et al. |
| 2015/0263602 | A1* | 9/2015 | Drda ....................... H02M 1/36 363/21.02 |
| 2016/0293382 | A1 | 10/2016 | Sato et al. |
| 2017/0040174 | A1 | 2/2017 | Long et al. |

OTHER PUBLICATIONS

Maolin Long et al.; U.S. Appl. No. 15/617,366, filed Jun. 8, 2017 entitled "Systems and Methods for Transformer Coupled Plasma Pulsing With Transformer Coupled Capacitive Tuning Switching"; 43 pages.

Maolin Long et al.; U.S. Appl. No. 16/007,481, filed Jun. 13, 2018 entitled "Direct Drive RF Circuit for Substrate Processing Systems"; 37 pages.

U.S. Appl. No. 15/617,366, filed Jun. 8, 2017, Maolin Long.

* cited by examiner

DIRECT DRIVE RF CIRCUIT FOR SUBSTRATE PROCESSING SYSTEMS

CROSS-REFERENCE TO RELATED APPLICATIONS

The present disclosure is a continuation of U.S. patent application Ser. No. 16/007,481 filed on Jun. 13, 2018. The entire disclosure of the application referenced above is incorporated herein by reference.

FIELD

The present disclosure relates to substrate processing systems, and more particularly to drive circuits for supplying RF plasma power or an RF bias in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP). The inductively-coupled plasma may be generated by coils arranged outside of a processing chamber adjacent to a dielectric window. Process gas flowing inside the processing chamber is ignited to create plasma. In some applications, RF plasma power is output to one or more inductive coils that are arranged outside of the processing chamber. RF bias power may also be supplied to an electrode in the substrate support.

The frequency of the RF plasma power or RF bias power can be varied to provide additional process control. In addition, a magnitude or level of the RF plasma power or the RF bias power can be varied during processing to provide additional process control. Changes in the RF plasma power or level and/or the RF bias power or level can cause changes in the impedance seen by the drive circuit. When an impedance mismatch occurs between the load and the drive circuit, power is reflected, which is inefficient.

SUMMARY

A direct drive circuit for providing RF power to a component of a substrate processing system includes a clock generator to generate a clock signal at a first frequency, a gate driver to receive the clock signal and a half bridge circuit. The half bridge circuit includes a first switch with a control terminal connected to the gate driver, a first terminal and a second terminal; a second switch with a control terminal connected to the gate driver, a first terminal connected to the second terminal of the first switch and an output node, and a second terminal; a first DC supply to supply a first voltage potential to the first terminal of the first switch; and a second DC supply to supply a second voltage potential to the second terminal of the second switch. The first voltage potential and the second voltage potential have opposite polarity and are approximately equal in magnitude.

In other features, a current sensor senses current at the output node and generates a current signal. A voltage sensor senses a voltage at the output node and generates a voltage signal. A controller includes a phase offset calculator to calculate a phase offset between the voltage signal and the current signal and a clock adjuster to adjust the first frequency based on the phase offset.

In other features, the clock adjuster increases the first frequency when the current leads the voltage and decreases the first frequency when the voltage leads the current. A first circuit connects the output node to the component of the substrate processing system. The first circuit includes a first capacitor connected to the output node and a first inductor connected in series with the first capacitor.

In other features, the first circuit further includes a second inductor having a first terminal connected to the output node; a third inductor having a first terminal connected to a second terminal of the second inductor; a second capacitor connected in parallel with the second inductor; and a third capacitor having a first terminal connected to the second terminal of the third inductor.

A dual frequency drive circuit includes the direct drive circuit and an additional drive circuit connected to the component of the substrate processing system and operating at a second frequency that is different than the first frequency.

In other features, the additional drive circuit includes a second one of the direct drive circuit.

In other features, the additional drive circuit includes an RF generator generating an RF signal at the second frequency. The additional drive circuit further includes an output circuit including a matching circuit to match an impedance of the RF generator to the component. The output circuit includes a first inductor connected to an output of the RF generator; a second inductor; and a first variable capacitor having a first terminal connected to the output and a second terminal connected to the second inductor.

In other features, the output circuit further includes a third inductor having a first terminal connected to the output; a second variable capacitor having a first terminal connected to a second terminal of the third inductor; a fourth inductor having a first terminal connected to a second terminal of the second variable capacitor; and a first capacitor having a first terminal connected to a second terminal of the fourth inductor and a second terminal connected to the component.

A drive circuit for providing RF power to a component of a substrate processing system includes a first direct drive circuit connected to the component of the substrate processing system and including a first clock generator to generate a first clock signal at a first frequency and a first gate driver to receive the first clock signal. A first half bridge circuit is connected between the first gate driver and a first output node. The first half bridge circuit biased by a first DC supply and a second DC supply. A first voltage potential supplied by the first DC supply and a second voltage potential supplied by the second DC supply have opposite polarity and are approximately equal in magnitude. A first blocking circuit connects the first output node to the component of the substrate processing system and blocks a second frequency that is different than the first frequency. A second drive circuit is connected to the component of the substrate processing system and operates at the second frequency.

In other features, a current sensor senses current at the first output node and to generate a current signal. A voltage sensor senses a voltage at the first output node and to generate a voltage signal. A controller includes a phase offset calculator to calculate a phase offset between the voltage signal and the current signal and a clock adjuster to adjust the first frequency based on the phase offset.

In other features, the clock adjuster increases the first frequency when the current leads the voltage and decreases the first frequency when the voltage leads the current. The first blocking circuit include a first capacitor connected to the first output node and a first inductor connected in series with the first capacitor.

In other the features, the first blocking circuit further includes a second inductor having a first terminal connected to the first output node; a third inductor having a first terminal connected to a second terminal of the second inductor; a second capacitor connected in parallel with the second inductor; and a third capacitor having a first terminal connected to the second terminal of the third inductor.

In other features, the second drive circuit includes an RF generator to generate an RF signal at the second frequency. The second drive circuit further includes a first output circuit including an adjustable matching circuit to match an impedance of the RF generator to the component. The first output circuit includes a first inductor connected to the RF generator; a second inductor; and a first variable capacitor having a first terminal connected to the RF generator and a second terminal connected to the second inductor.

In other features, the first output circuit further includes a third inductor having a first terminal connected to the RF generator; a second variable capacitor having a first terminal connected to a second terminal of the third inductor; a fourth inductor having a first terminal connected to a second terminal of the second variable capacitor; and a first capacitor having a first terminal connected to a second terminal of the fourth inductor and a second terminal connected to the component.

In other features, the second drive circuit includes a second clock generator to generate a second clock signal at the second frequency; a second gate driver to receive the second clock signal; a second half bridge circuit including a second half bridge circuit connected between the second gate driver and a second output node, the second half bridge circuit biased by a third DC supply and a fourth DC supply, wherein a first voltage potential supplied by the third DC supply and a second voltage potential supplied by the fourth DC supply have opposite polarity and are approximately equal in magnitude; and a second blocking circuit to connect the second output node to the component of the substrate processing system and to block the first frequency.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In some applications, a frequency of the RF source power supplied to the ICP coil and/or an RF bias to an electrode in the substrate support is switched between two or more frequencies and/or two or more pulsing levels. RF pulsing at more than one frequency and/or more than one level is shown and described in commonly-assigned U.S. patent application Ser. No. 15/617,366 filed on Jun. 8, 2017 and entitled "Systems and Methods for Transformer Coupled Plasma Pulsing with Transformer Coupled Capacitive Tuning Switching", which is hereby incorporated by reference in its entirety.

In these systems, an impedance of an RF generator is matched to a load (such as the inductive coils and the plasma or the electrode and the plasma). However, the impedance of the load changes as the plasma conditions vary, the pulsing level changes, and/or due to various other factors. When impedance mismatch occurs, power is reflected by the load, which is inefficient. Tuning of the circuits using variable capacitors is difficult due to the amount of time that is required to change the value of the capacitance relative to the switching period between frequency changes and/or level to level changes.

Systems and methods according to the present disclosure relate to a direct drive circuit, a dual frequency hybrid circuit including the direct drive circuit and a dual frequency direct drive circuit. The direct drive circuit according to the present disclosure removes DC bias in a half bridge circuit using two DC supplies operating at opposite polarities and half of the desired DC magnitude. The direct drive circuit according to the present disclosure also operates at low impedance, which eliminates the matching problems described above. The dual frequency hybrid circuit combines the direct drive circuit with a drive circuit operating at a higher frequency and higher impedance (such as 50 ohms). The dual frequency direct drive circuit combines two of the direct drive circuits operating at two different frequencies.

Figure 1:
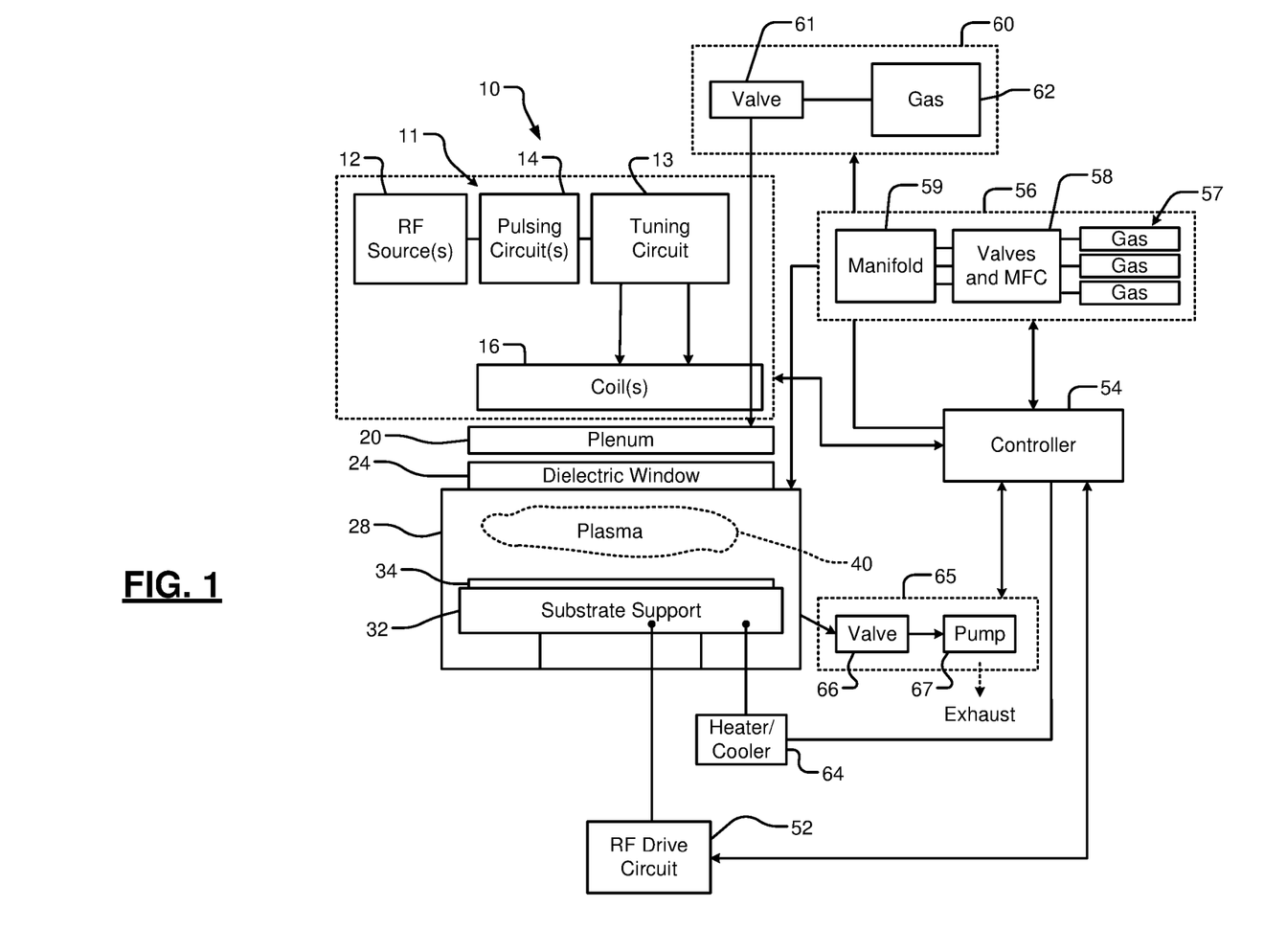
FIG. 1 is a functional block diagram of an example of a substrate processing system.

Referring now to FIG. 1, an example of a substrate processing system 10 according to the present disclosure is shown. The substrate processing system 10 includes a coil driving circuit 11. A pulsing circuit 14 may be used to pulse the RF power on and off or vary an amplitude or level of the RF power. The tuning circuit 13 may be directly connected to one or more inductive coils 16. The tuning circuit 13 tunes an output of the RF source 12 to a desired frequency and/or a desired phase, matches an impedance of the coils 16 and splits power between the coils 16. In some examples, the coil driving circuit 11 is replaced by one of the drive circuits described further below in conjunction with controlling the RF bias.

In some examples, a plenum 20 may be arranged between the coils 16 and a dielectric window 24 to control the temperature of the dielectric window 24 with hot and/or cold air flow. The dielectric window 24 is arranged along one side of a processing chamber 28. The processing chamber 28 further comprises a substrate support (or pedestal) 32. The substrate support 32 may include an electrostatic chuck (ESC), or a mechanical chuck or other type of chuck. Process gas is supplied to the processing chamber 28 and plasma 40 is generated inside of the processing chamber 28. The plasma 40 etches an exposed surface of the substrate 34. A drive circuit 52 (such as one of those described below) may be used to provide an RF bias to an electrode in the substrate support 32 during operation.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas delivery system 60 may be used to deliver gas 62 via a valve 61 to the plenum 20. The gas may include cooling gas (air) that is used to cool the coils 16 and the dielectric window 24. A heater/cooler 64 may be used to heat/cool the substrate support 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, and so on. Additionally, as described below in detail, the controller 54 may control various aspects of the coil driving circuit 11 and the drive circuit 52.

Figure 2:
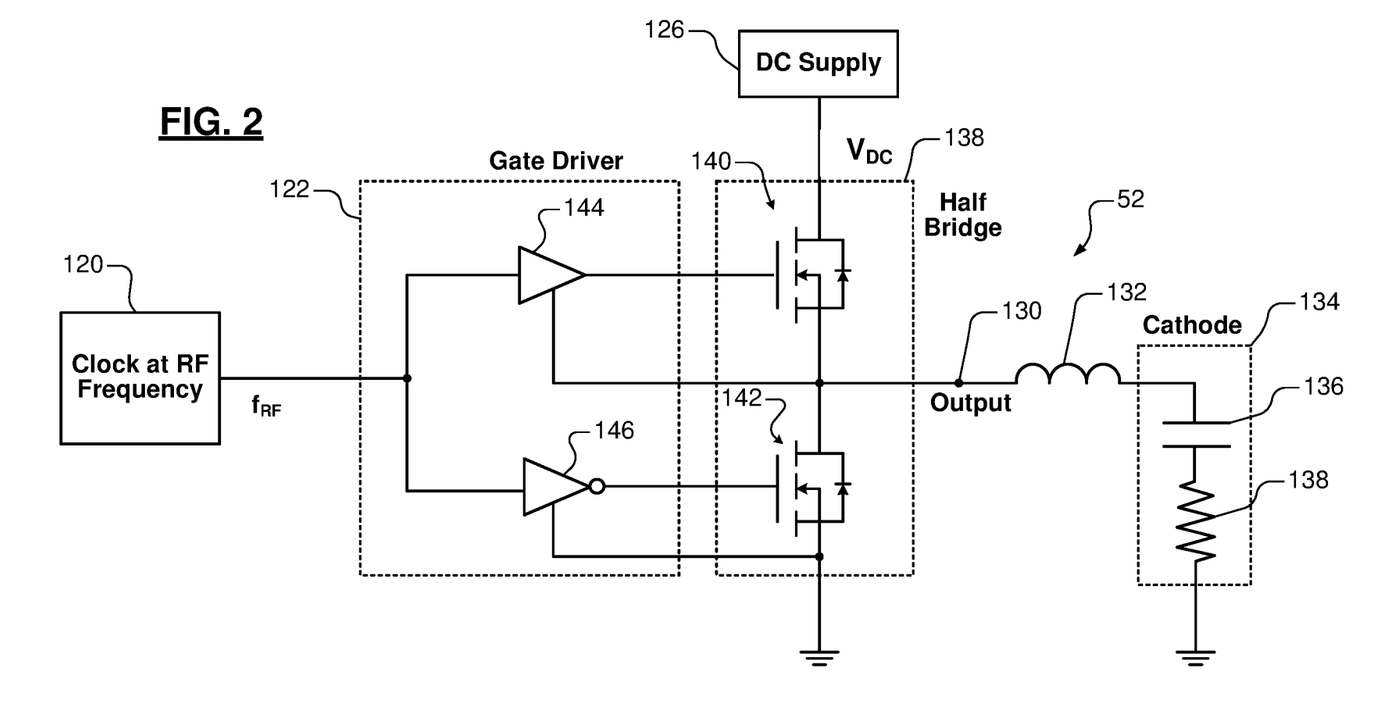
FIG. 2 is a functional block diagram of an example of a drive circuit.

Referring now to FIG. 2, an example of the drive circuit 52 for supplying the RF bias (or the RF plasma power) is shown. The drive circuit 52 includes a clock 120 that operates at one or more selected RF frequencies. The clock signal output by the clock 120 is input to a gate driver circuit 122. In some examples, the gate driver circuit 122 includes an amplifier 144 and an inverting amplifier 146 having respective inputs connected to the clock 120.

Outputs of the gate driver circuit 122 is input to a half bridge circuit 138. In some examples, the half bridge circuit 138 includes a first switch 140 and a second switch 142. In some examples, the first switch 140 and the second switch 142 include metal oxide semiconductor field effect transistors (MOSFETs). The first switch 140 and the second switch 142 each include a control terminal, and first and second terminals. An output of the amplifier 144 of the gate driver circuit 122 is input to the control terminal of the first switch 140. An output of the inverting amplifier 146 of the gate driver circuit 122 is input to the control terminal of the second switch 142.

An output node 130 is connected to the second terminal of the first switch 140 and to the first terminal of the second switch 142. The first terminal of the first switch 140 is connected to the DC supply 126. The second terminal of the second switch 142 is connected to a reference potential such as ground.

The output node 130 is connected by an inductor 132 to a cathode 134. In some examples, a capacitance $C_p$ in series with a resistance $R_p$ may be used to model the impedance seen by the drive circuit 52 (e.g. plasma capacitance and resistance, the capacitance and resistance of the electrode (or another component) in the substrate support and/or other stray or parasitic capacitance and resistance).

The drive circuit in FIG. 2 uses a single DC supply 126 that can produce undesired DC voltage/component on a base plate of the ESC. This DC component can complicate the wafer chucking/dechucking performance by affecting the ESC DC bias on the base plate that is expected to be independently controlled.

Figure 3:
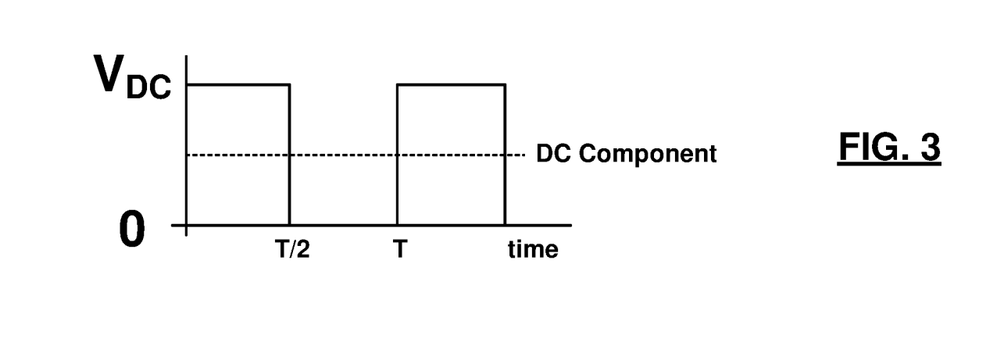
FIG. 3 is a graph illustrating DC voltage as a function of time for the drive circuit in FIG. 2.

Referring now to FIG. 3, a Fourier transform of the voltage waveform at the output 130 of the half bridge circuit 138 in FIG. 2 can be expressed in equation form as:

$$v(t) = \frac{V_{DC}}{2} + \sum_{k=1,3,5,\ldots}^{\infty} \left( \frac{2V_{DC}}{k\pi} \sin(2\pi k t / T) \right)$$

where $T=1/f_{RF}$ and $f_{RF}$ is the RF frequency. When the harmonics on the right hand side of equation are filtered using a low pass filter, the fundamental frequency at $f_{RF}$ and the DC component of $V_{DC/2}$ remain.

Figure 4:
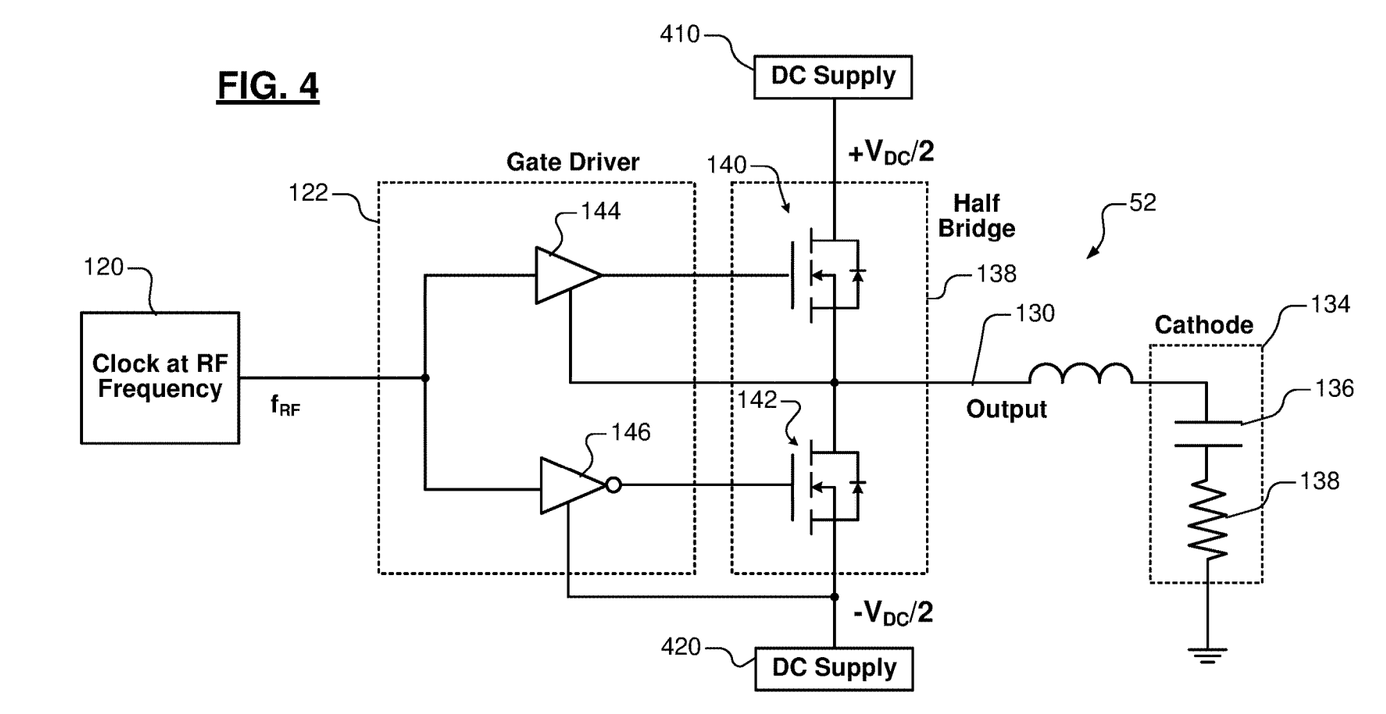
FIG. 4 is a functional block diagram of an example of a direct drive circuit according to the present disclosure.

Referring now to FIG. 4, to resolve the undesired DC voltage on the base plate, the drive circuit 52 according to the present disclosure uses dual DC supplies. The drive circuit 52 includes a first DC supply 410 operating at $+V_{DC}/2$ and a second DC supply 420 operating at $-V_{DC}/2$. To achieve the same output RF power, both the first and second DC supplies 410, 420 operate at half the voltage of the single DC supply in FIG. 2. In some examples, the first DC supply 410 and the second DC supply 420 operate at approximately the same magnitude and opposite polarity. As used herein, approximately the same refers to a difference between a magnitude of the DC voltage output by the first DC supply 410 relative to the second DC supply 420 that is less than 10%, 5% or 1%. The first DC supply 410 is connected to the first terminal of the first switch 140. The second DC supply 420 is connected to the second terminal of the second switch 142.

Figure 5:
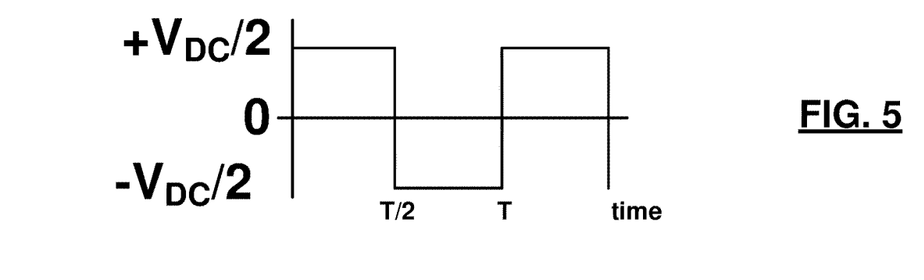
FIG. 5 is a graph illustrating DC voltage as a function of time for the drive circuit in FIG. 4.

Referring now to FIG. 5, the voltage waveform output by the drive circuit 52 in FIG. 4 has no DC component with the following Fourier transform:

$$v(t) = \sum_{k=1,3,5,\ldots}^{\infty} \left( \frac{2V_{DC}}{k\pi} \sin(2\pi k t / T) \right)$$

where $T=1/f_{RF}$ and $f_{RF}$ is the RF frequency. Therefore, there is no DC component as in the circuit of FIG. 2, which eliminates the problems associated therewith.

Figure 6:
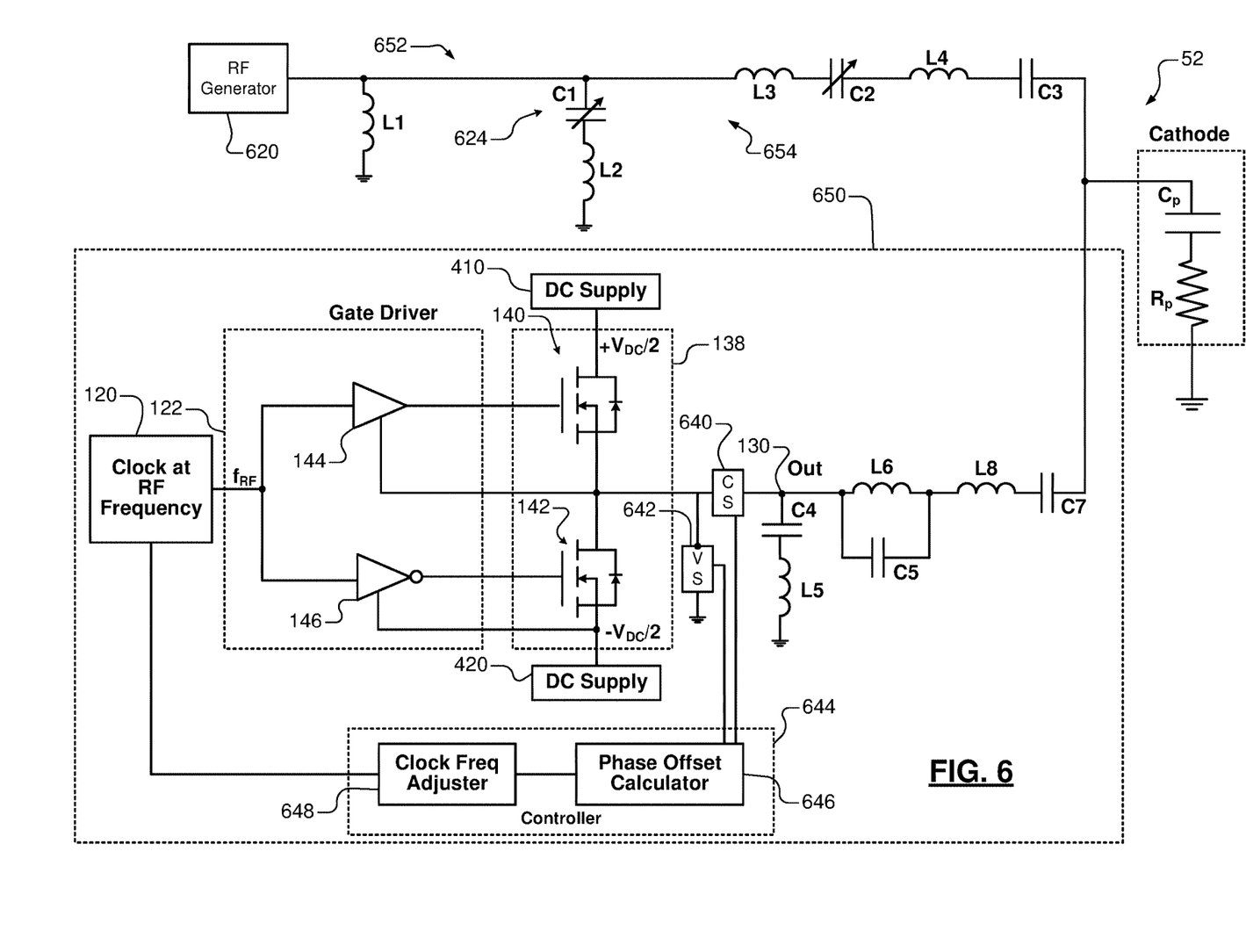
FIG. 6 is a functional block diagram of an example of a hybrid dual frequency drive circuit according to the present disclosure.

Referring now to FIG. 6, the drive circuit 52 includes a direct drive circuit 650 operating at a first frequency and a drive circuit 652 operating at higher impedance and a second frequency different than the first frequency. The drive circuit 52 provides a dual frequency RF bias at a relatively low cost as compared to prior designs. In some examples, the direct drive circuit 650 operates at 1 MHz and the drive circuit 652 operates at 13.56 MHz (50-ohm), although other frequencies can be used.

The direct drive circuit 650 includes the clock 120, the gate driver circuit 122, the half bridge circuit 138, the first DC supply 410 and the second DC supply 420 as described above. The output node 130 is connected by first and second inductors L6 and L8 that are connected in series to a first terminal of a capacitor C7. A second terminal of the capacitor C7 is connected to the cathode 134. A capacitor C4 is connected in series with an inductor L5 to the output node 130. A capacitor C5 is connected in parallel with the inductor L6.

In some examples, capacitance and inductance values of the capacitor C4 and the inductor L5 are selected to resonate at the second frequency. In some examples, capacitance and inductance values of the capacitor C5 and the inductor L6 are selected to resonate at the second frequency of the drive circuit 652. One or both of the resonant circuits C4/L5 and/or C5/L6 can be used to block or filter out the second frequency and/or to protect circuits beyond the output node 130. In some examples, one or both of the resonant circuits C4/L5 and/or C5/L6 are omitted. The inductances L6 and L8 in combination with the capacitor Cp form a resonant circuit that resonates at the first frequency of the drive circuit 650.

To supply an RF bias at the second frequency, the drive circuit 652 includes an RF generator 620 connected to one terminal of the inductor L1. A second terminal of the inductor L1 is connected to a reference potential such as ground. The first terminal of the inductor L1 is connected to a resonant circuit 624 and a first terminal of an inductor L3. The resonant circuit 624 includes a variable capacitor C1 connected in series with an inductor L2. A second terminal of the inductor L2 is connected to a reference potential such as ground.

A second terminal of the inductor L3 is connected to a first terminal of a variable capacitor C2. The first variable capacitor C1 and the second variable capacitor C2 perform as a matching circuit 654. A second terminal of the variable capacitor C2 is connected by an inductor L4 to a first terminal of the capacitor C3. A second terminal of the capacitor C3 is connected to the cathode 134. A first pulsing level of the RF bias supplied by the RF generator 620 is matched to an impedance such as 50Ω using the variable capacitors C1 and C2. However, matching to other pulsing levels is done by changing the frequency of the RF generator 620 when the variable capacitors C1 and C2 are physical capacitors that include overlapping cylinders. When used, the capacitance of the variable capacitors C1 and C2 is adjusted using motors that adjust the amount of overlap. However, these capacitors generally cannot be adjusted quickly enough for level to level pulsing.

A current sensor 640 is connected to the output node 130. Likewise, a voltage sensor 642 is connected to the output node 130. Sensed current output by current sensor 640 and sensed voltage output by the voltage sensor 642 are input to a controller 644 including a phase offset calculator 646 and a clock frequency adjuster 648.

The phase offset calculator 646 determines the phase offset between the voltage and current. The phase offset calculator 646 outputs the phase offset to a clock frequency adjuster 648. When the voltage leads the current, the clock frequency adjuster 648 decreases the frequency of the clock 120. When the current leads the voltage, the clock frequency adjuster 648 increases the frequency of the clock 120. In some examples, hysteresis may be used. In some examples, the clock frequency adjuster 648 decreases the frequency of the clock 120 when the voltage leads the current by a predetermined first threshold TH1. In some examples, the clock frequency adjuster 648 decreases the frequency of the clock 120 when the voltage leads the current by a predetermined second threshold TH2.

Figure 7:
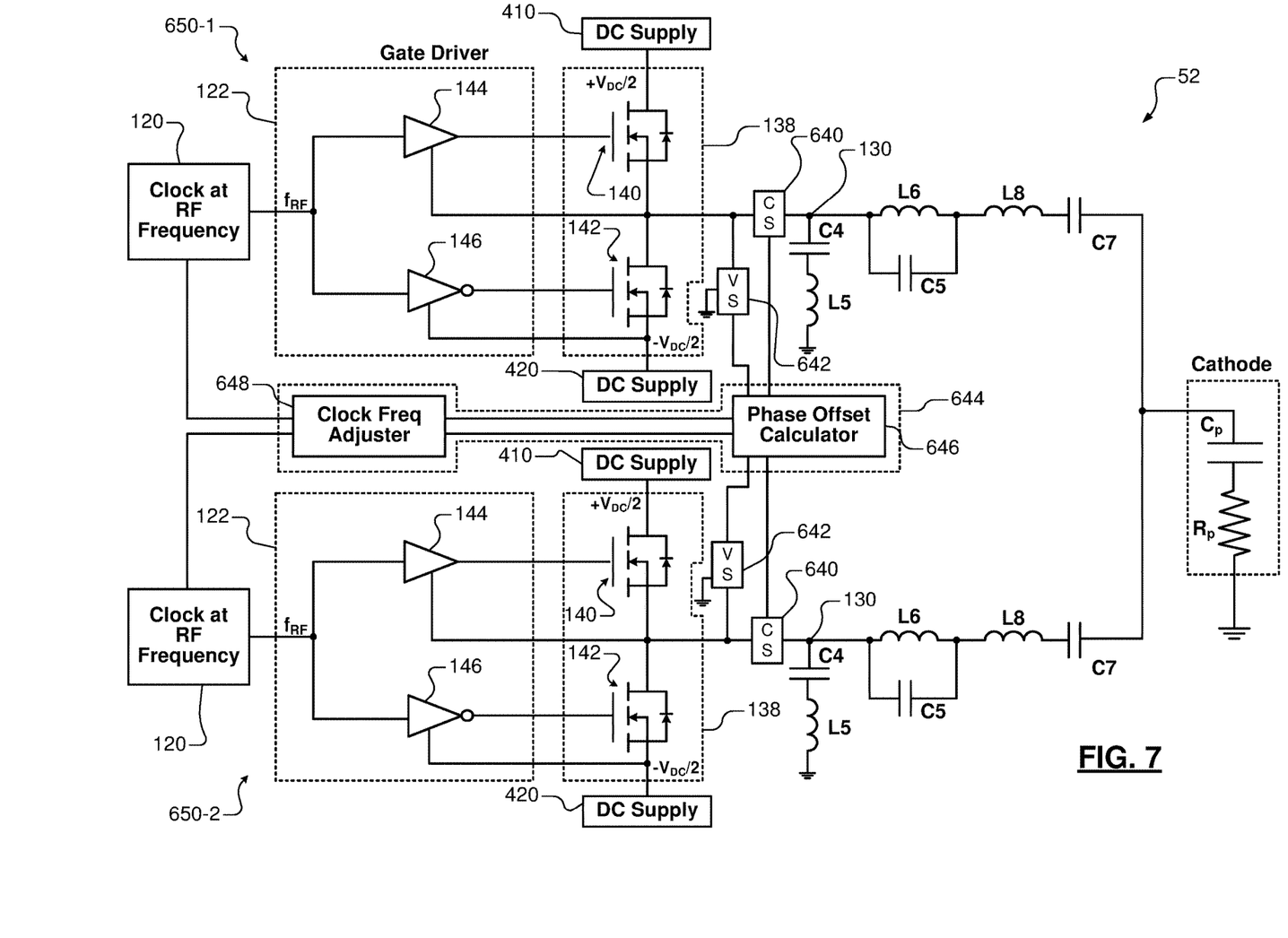
FIG. 7 is a functional block diagram of an example of a dual frequency drive circuit according to the present disclosure.

Referring now to FIG. 7, both of the drive circuits can be direct drive circuits as shown at 650-1 and 650-2. The direct drive circuit 650-1 operates as described above. The direct drive circuit 650-2 is similar to the direct drive circuit 650 in FIG. 6.

In some examples, capacitance and inductance values of the capacitor C4 and the inductor L5 of the direct drive circuit 650-2 are selected to resonate at the first frequency. In some examples, capacitance and inductance values of the capacitor C5 and the inductor L6 of the direct drive circuit 650-2 are selected to resonate at the first frequency. One or both of the resonant circuits C4/L5 and/or C5/L6 of the direct drive circuit 650-2 can be used to block or filter out the first frequency and/or to protect circuits beyond the output node 130 of the direct drive circuit 650-2. In some examples, one or both of the resonant circuits C4/L5 and/or C5/L6 are omitted. The inductances L6 and L8 of the direct drive circuit 650-2 in combination with the capacitor Cp form a resonant circuit that resonates at the second frequency.

Current sensors 640 are connected to the output nodes 130 of the direct drive circuits 650-1 and 650-2. Likewise, voltage sensors 642 are connected to the output nodes 130 of the direct drive circuits 650-1 and 650-2. Sensed current output by current sensors 640 and sensed voltage output by the voltage sensors 642 are input to the controller 644 including the phase offset calculator 646 and the clock frequency adjuster 648. The clock frequencies of the clocks 120 of the direct drive circuits 650-1 and 650-2 are individually adjusted as described above. While a single controller 644 is shown, dedicated controllers can be used for each of the direct drive circuits 650-1 and 650-2.

Figure 8:
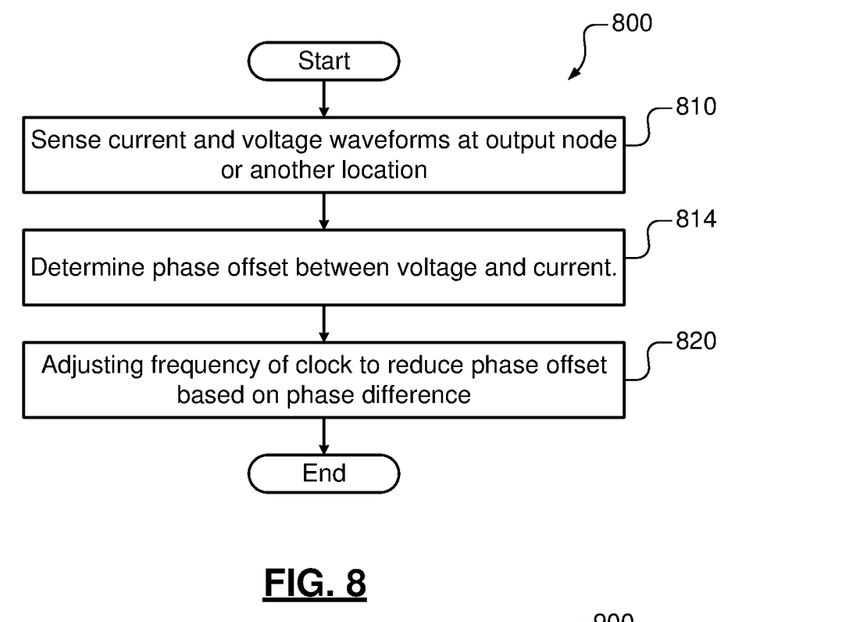
FIGS. 8 and 9 are flowcharts of examples of methods for adjusting a frequency of the clock generator based on the phase offset according to the present disclosure.

Referring now to FIG. 8, a method 800 for controlling the direct drive circuit is shown. At 810, current and voltage waveforms are sensed at the output node or another location. At 814, a phase offset is determined between the voltage and current waveforms. For example, zero crossings of the current and voltage can be monitored. A difference in timing of the zero crossings can be used to determine the phase offset. At 820, a frequency of the clock is adjusted to reduce phase offset between the voltage and current.

Figure 9:
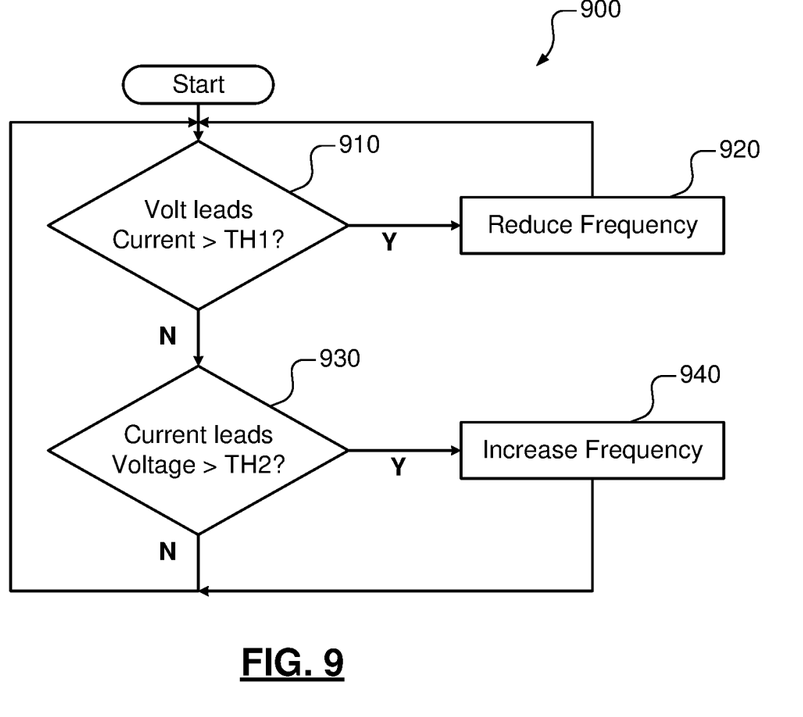

Referring now to FIG. 9, a method 900 for adjusting the frequency of the clock is shown. When the voltage leads the current as determined at 910, the frequency is reduced at 920. In some examples, the voltage needs to lead the current by more than a first threshold TH1 before the frequency is reduced. When the current leads the voltage as determined at 930, the frequency is increased at 940. In some examples, the current needs to lead the voltage by more than a second threshold TH2 before the frequency is increased. In other examples, hysteresis is not used.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A direct drive circuit for providing RF power to a component of a substrate processing system, comprising:
   a clock generator to generate a clock signal;
   a gate driver to receive the clock signal;
   a half bridge circuit including:
      a first switch with a first control terminal connected to a first output of the gate driver, a first terminal, and a second terminal;
      a second switch with a second control terminal connected to a second output of the gate driver, a third terminal connected to the second terminal of the first switch and an output node, and a fourth terminal;
   a first DC supply to supply a first voltage to the first terminal;
   a second DC supply to supply a second voltage to the fourth terminal, the first and second voltages being approximately equal and of opposite polarities; and
   at least one of an inductor and a capacitor connecting the output node to the component of the substrate processing system,
   wherein the direct drive circuit supplies the RF power to the component of the substrate processing system connected across a reference potential and the at least one of the inductor and the capacitor; and wherein the first and second voltages supplied by the first and second DC supplies reduce a DC component in the RF power supplied to the component of the substrate processing system.

2. The direct drive circuit of claim 1 further comprising:
a current sensor to sense a current at the output node and to generate a current signal;
a voltage sensor to sense a voltage at the output node and to generate a voltage signal; and
a controller including:
    a phase offset calculator to sense a phase offset between the voltage signal and the current signal; and
    a clock adjuster to adjust a frequency of the clock signal based on the phase offset.

3. The direct drive circuit of claim 2 wherein the clock adjuster increases the frequency of the clock signal when the current leads the voltage and decreases the frequency when the voltage leads the current.

4. The direct drive circuit of claim 1 wherein the at least one of the inductor and the capacitor includes:
a first capacitor connected to the output node;
a first inductor connected in series with the first capacitor;
a second inductor with a first terminal connected to the output node;
a third inductor with a first terminal connected to a second terminal of the second inductor;
a second capacitor connected in parallel with the second inductor; and
a third capacitor with a first terminal connected to the second terminal of the third inductor and a second terminal connected to the component of the substrate processing system.

5. A dual frequency drive circuit comprising:
the direct drive circuit of claim 4; and
a second drive circuit connected to the component of the substrate processing system and operating at a different frequency than the direct drive circuit.

6. The dual frequency drive circuit of claim 5 wherein the second drive circuit includes:
an RF generator generating an RF signal at the different frequency; and
an output circuit including a matching circuit to match an impedance of the RF generator to the component of the substrate processing system.

7. The dual frequency drive circuit of claim 6 wherein the output circuit includes:
a first inductor of the output circuit connected to an output of the RF generator;
a first variable capacitor of the output circuit with a first terminal connected to the output of the RF generator;
a second inductor of the output circuit connected to a second terminal of the first variable capacitor;
a third inductor of the output circuit with a first terminal connected to the output of the RF generator;
a second variable capacitor of the output circuit with a first terminal connected to a second terminal of the third inductor;
a fourth inductor of the output circuit with a first terminal connected to a second terminal of the second variable capacitor; and
a third capacitor of the output circuit with a first terminal connected to a second terminal of the fourth inductor and a second terminal connected to the component.

8. A dual frequency drive circuit comprising:
the direct drive circuit of claim 4; and
a second one of the direct drive circuit of claim 4 connected to the component of the substrate processing system.

* * * * *